(12) United States Patent
Leifer et al.

(10) Patent No.: US 8,724,333 B2
(45) Date of Patent: May 13, 2014

(54) ELECTRICAL FIELD DEVICE AND EXPANSION MODULE FOR INSERTION INTO AN ELECTRICAL FIELD DEVICE

(75) Inventors: Christoph Leifer, Bad Driburg (DE); Andre Korrek, Marienmuenster (DE)

(73) Assignee: Phoenix Contact GmbH & Co. KG, Blomberg (DE)

(*) Notice: Subject to any disclaimer, the term of this patent is extended or adjusted under 35 U.S.C. 154(b) by 117 days.

(21) Appl. No.: 13/159,693

(22) Filed: Jun. 14, 2011

(65) Prior Publication Data
US 2011/0255248 A1    Oct. 20, 2011

Related U.S. Application Data

(62) Division of application No. 11/689,656, filed on Mar. 22, 2007, now Pat. No. 7,983,049.

(30) Foreign Application Priority Data

Mar. 22, 2006  (DE) .......................... 10 2006 013 632
Jun. 19, 2006  (DE) .......................... 10 2006 028 361

(51) Int. Cl.
*H05K 1/14*    (2006.01)
(52) U.S. Cl.
USPC ............ 361/736; 361/728; 361/801; 439/951
(58) Field of Classification Search
USPC ............... 361/736, 728, 801; 439/62, 65, 951
See application file for complete search history.

(56) References Cited

U.S. PATENT DOCUMENTS

| | | | |
|---|---|---|---|
| 4,883,427 A | 11/1989 | Kohl et al. | |
| 5,155,663 A | 10/1992 | Harase | |
| 5,341,421 A * | 8/1994 | Ugon ............................ | 345/163 |
| 5,541,810 A | 7/1996 | Donhauser et al. | |
| 5,902,991 A | 5/1999 | Kumar | |
| 6,275,881 B1 | 8/2001 | Doege et al. | |
| 6,631,276 B1 | 10/2003 | Yamaguchi et al. | |
| 7,359,208 B2 * | 4/2008 | Ni ................................. | 361/752 |
| 2004/0128419 A1 * | 7/2004 | Chien-Chung ............... | 710/300 |
| 2004/0233629 A1 * | 11/2004 | Wang et al. .................... | 361/684 |
| 2005/0083670 A1 * | 4/2005 | Peloza ........................... | 361/801 |

FOREIGN PATENT DOCUMENTS

| | | |
|---|---|---|
| DE | 101 61 401 A1 | 6/2003 |
| DE | 10 2004 025 484 A1 | 12/2005 |
| EP | 0 499 675 A1 | 8/1992 |
| WO | 2005/106606 A1 | 11/2005 |
| WO | 2006/008284 A1 | 1/2006 |
| WO | 2006/013155 A1 | 2/2006 |

* cited by examiner

*Primary Examiner* — Timothy Thompson
*Assistant Examiner* — Andargie M Aychillhum
(74) *Attorney, Agent, or Firm* — Roberts Mlotkowski Safran & Cole, P.C.; David S. Safran

(57) ABSTRACT

An electronic expansion module which has at least one circuit board, that has a contact region with contacts for mechanical and electrical contact-making with mating contacts connected to the circuit board of the expansion module and a circuit board recess formed such that, with the expansion module inserted into an opening formed on a side of the housing of an electrical field device for use in industrial control, the circuit board of the expansion module does not have any conductive connection to the electrical field device except in the contact region so that reliable electrical isolation between the interior of the device and the user is ensured.

9 Claims, 8 Drawing Sheets

ELECTRICAL FIELD DEVICE AND EXPANSION MODULE FOR INSERTION INTO AN ELECTRICAL FIELD DEVICE

CROSS REFERENCE TO RELATED APPLICATION

This application is a divisional of commonly owned, U.S. patent application Ser. No. 11/689,656, filed Mar. 22, 2007.

BACKGROUND OF THE INVENTION

1. Field of the Invention

The invention relates to an electrical field device for use in industrial control, with a housing, with at least one input, at least one output, and with an electronic circuit which has a microcontroller, a memory and a circuit board. In addition, the invention relates to an expansion module for insertion into an electrical field device, with a housing and with an electronic circuit which has a circuit board.

2. Description of Related Art

Electrical field devices are used in the field of automation for control of systems and machinery in different versions. The heart of the automation is the control which communicates with the individual sensors and actuators which monitor, control and adjust the respective process. For smooth communications between the process and the control, signal matching is often necessary, for which corresponding electrical devices are used which, as a result of their arrangement on the field site, are called field devices. Functionally, these field devices can also in general be called signal converters, the signal converters providing, for example, for signal matching of digital, analog, serial or current and voltage signals between the field side and the control side. The electrical field devices, which can also be called interface modules, are generally used for potential separation between the various signal forms and voltage levels of the signals meeting one another. Therefore, electrical field devices can also be used to separate, amplify, or convert individual signals.

Within the framework of this invention, electrical field devices are defined not only as the above described interface modules or signal converters, but especially relay interfaces in the form of electromechanical load relays or safety relays and optical coupler modules and modular converters for measurement and control engineering, such as, for example, temperature and frequency converters.

If these electrical field devices are connected to a higher-order control via a bus line, configuration of the field devices can take place directly via the bus by means of the control. However, often, it happens that the electrical field devices are used as so-called "stand-alone devices", i.e., the field devices either do not have a bus connection or are not connected to a bus. Then, configuration of these field devices must take place directly on the device itself.

For simple field devices which have only limited functionality and thus also only a limited number of parameters to be set, configuration of the field devices often takes place by means of rotary coding switches, potentiometers or DIP switches. Electrical field devices with higher complexity often have an operating part with a keyboard and a display for setting and displaying the individual parameters. Due to the generally only limited available space for the keyboard and the display, usually only two or three keys are available for input of the individual parameters, so that complete configuration of the field device is very tedious.

Due to the increasing functionality of electrical field devices, configuration of field devices is also becoming more and more complex, so that control and configuration using operating elements mounted directly on the field device is very difficult. Continually advancing miniaturization leads, moreover, to the fact that, among practicable and ergonomic aspects, it is more and more rarely possible to implement the operating interface directly on the field device. Therefore, in practice, for electrical field devices with medium or high complexity, configuration generally takes place by means of operating software, for which the field devices must be connected to a computer or a laptop.

Additional problems occur in case of a fault or service, since then, either the parameters must be tediously read out from the defective field device by means of the display, or they must be taken from system documentation and transmitted into a new field device. Transmission of data by means of operating software does reduce the parameterization cost, but requires use of a computer and generally the presence of the correspondingly trained personnel.

SUMMARY OF THE INVENTION

Therefore, a primary object of this invention is to develop the initially described electrical field device such that the above described problems and disadvantages of the prior art are overcome or at least reduced and the field device can be easily adapted to different functions and conditions of use.

This object is achieved in the initially described electrical field device in that, on one side of the housing, an opening is formed for insertion of an electronic expansion module which has at least one circuit board, that the circuit board of the field device in the contact region has contacts for mechanical and electrical contact-making of mating contacts connected to the circuit board of the expansion module, and that a recess is formed in the circuit board such that an inserted expansion module does not have any conductive contact with the field device except in the contact region.

Thus, first of all, it is provided in accordance with the invention that the electrical field device has an opening for holding the corresponding expansion module and has a corresponding contact region for electrical contact-making of the expansion module. Thus, the expansion module can be easily inserted through the opening in the housing into the field device, for complete insertion of the expansion module, at the same time, electrical contact being made. The opening in the housing of the field device is thus made such that most of the inserted expansion module is located within the housing of the field device. It is important here that the electrical contact region between the circuit board of the electrical field device and the circuit board of the expansion module is located within the housing to the extent that unwanted touching of the contact elements cannot occur.

The recess formed in the circuit board ensures that the potential separation implemented by the electrical field device between the input and the output side and especially also between the device interior and the user remains ensured. Additional metallic separation is thus not necessary, so that the added circuitry cost for implementing the contact region within the electrical field device is low.

It has already been mentioned that, when the expansion module is completely pushed or inserted into the electrical field device, contact is automatically made between the contacts of the circuit board of the field device and the mating contacts of the field module. For this purpose, the circuit board has either a socket for holding the corresponding plug-in contacts or has plug-in contacts for insertion into the corresponding socket of the expansion module in the contact region.

Preferably, it is provided that the electrical field device is made to accommodate various expansion modules. If the expansion module is, for example, a configuration memory, the configuration of the electrical field device in start-up or in the case of service can simply take place by a corresponding expansion module being inserted into the opening of the field device. Thus, complex parameterization by hand or use of a computer is not necessary.

If the electrical field device is suited for holding different expansion modules, it is preferably provided that the microcontroller present in the electrical field device automatically detects the functionality of the inserted expansion module. Detection of the type of inserted expansion module can take place, for example, using the interconnection of the mating contacts of the expansion module. In particular, detection of the respective mating contact or contacts of the expansion module which is or are connected to the reference potential is possible here.

As has already been stated, due to the recessed arrangement of the contact region in the housing of the electrical field device and the execution of the recess in the circuit board of the field device, formation of additional metallic separation in the field device is not necessary. Therefore, to implement the electrical connection to the expansion module, preferably, in addition to the contacts only, a resistor array for termination, and optionally, a diode array for overvoltage protection are connected between the microcontroller and contacts.

In addition to the above described electrical field device, this invention also relates to an expansion module for plugging into an electrical field device, the expansion module having a housing and a circuit board located in the housing. This expansion module is characterized in accordance with the invention in that the circuit board has mating contacts on an end for making electrical contact with contacts which are connected to the circuit board of the electrical field device, the mating contacts being accessible from outside the housing such that, in the inserted state of the expansion module, there is no conductive connection to the field device apart from that in the area of the mating contacts.

As was stated above, in conjunction with the electrical field device in accordance with the invention, the expansion module makes electrical contact with the field device automatically when the expansion module has been completely inserted. For this purpose, the circuit board of the expansion module has either plug-in contacts for insertion into a socket of the field device or a socket for holding the plug-in contacts made on the circuit board of the field device.

To ensure electrical isolation, the housing of the expansion module is made of plastic or has a plastic coating. Moreover, with the exception of the mating contacts, the circuit board is completely surrounded by the housing, preferably even potted within the housing.

Especially when the expansion module is used as a configuration memory, it has a memory module connected to the circuit board, especially an EEPROM or a FLASH memory. An expansion module which is being used as a configuration memory is then a passive expansion module which only reacts when it is addressed by the microcontroller of the electrical field device acting as the master. By the corresponding wiring of the mating contacts of the expansion module, and thus, the inputs of the memory module, especially of the "MODE input", the expansion module is detected by the microcontroller as the configuration memory, from the memory module of which the microcontroller reads out the data required for configuration as necessary.

The expansion module in accordance with the invention can be used not only as a configuration memory, but also, for example, for long-term data recording, then a memory module suitable for this purpose, for example, a ferromagnetic memory, being located on the circuit board of the expansion module.

According to a preferred configuration of the expansion module in accordance with the invention, especially for an embodiment as a configuration memory or as a long term memory, an inscription field is formed on the side of the housing opposite the mating contacts. By forming an inscription field, the danger of confusion of an expansion module made as a configuration memory is easily prevented. The inscription field is preferably interchangeable so that the expansion module, if necessary, can be used for any field device after the corresponding programming.

In addition to executing the expansion module as a configuration or long term memory, the expansion module can also be made as an interface, especially as a BLUETOOTH® wireless interface or as an adapter, especially as an USB adapter. The circuit board of the expansion module is then connected to a corresponding transceiver or to a controller and a corresponding socket or a corresponding plug.

According to a last configuration, which will only be briefly mentioned here, the expansion module can also be made as an operating part, then on the side of the housing opposite the contacts, there is a control panel with at least one key and/or a display, especially a LCD display. Using such an expansion module which acts as an operating part, then smaller changes of the configuration of the electrical field device can be easily undertaken quickly on site. If the control panel has a display, with the expansion module, individual parameters and function data of the field device can be quickly and easily displayed on site.

Overall, there are a host of possibilities for embodying and developing the expansion module in accordance with the invention. Regardless of the electronic modules located on the circuit board of the expansion module and regardless of the specific execution of the housing of the expansion module, it is common to all expansion modules that they can be quickly and easily connected to the electrical field device by insertion; due to the countersunk installation position of the contact region, the standards with respect to reliable separation which require up to 8 mm clearance in air and creepage distance are maintained. By the interchangeability of the expansion modules, an electrical field device can be quickly and easily matched to different requirements, without different field devices and complex modifications on the field device being necessary for this purpose.

In particular, there is now a host of possibilities for embodying and developing the electrical field device in accordance with the invention and the expansion module in accordance with the invention. In this respect reference is made both to the following description of preferred embodiments with reference to the accompanying drawings.

DETAILED DESCRIPTION OF THE INVENTION

FIGS. 1 to 4 show a portion of an electrical field device 1 with a housing 2. An electronic circuit comprised at least of a microcontroller 3, a memory 4 and a circuit board 5 are provided within the housing 2, with the microcontroller 3 and the memory 4 both being located on the circuit board. The memory 4 can be especially the internal memory of the microcontroller 3, so that the microcontroller 3 and memory 4 need be only functionally present, but not as separate components. Moreover, the electronic circuit also includes other electrical and electronic components which are located especially on the circuit board 5, but are not shown here, and the nature of which is dependent on the function of the field device.

Figure 5:
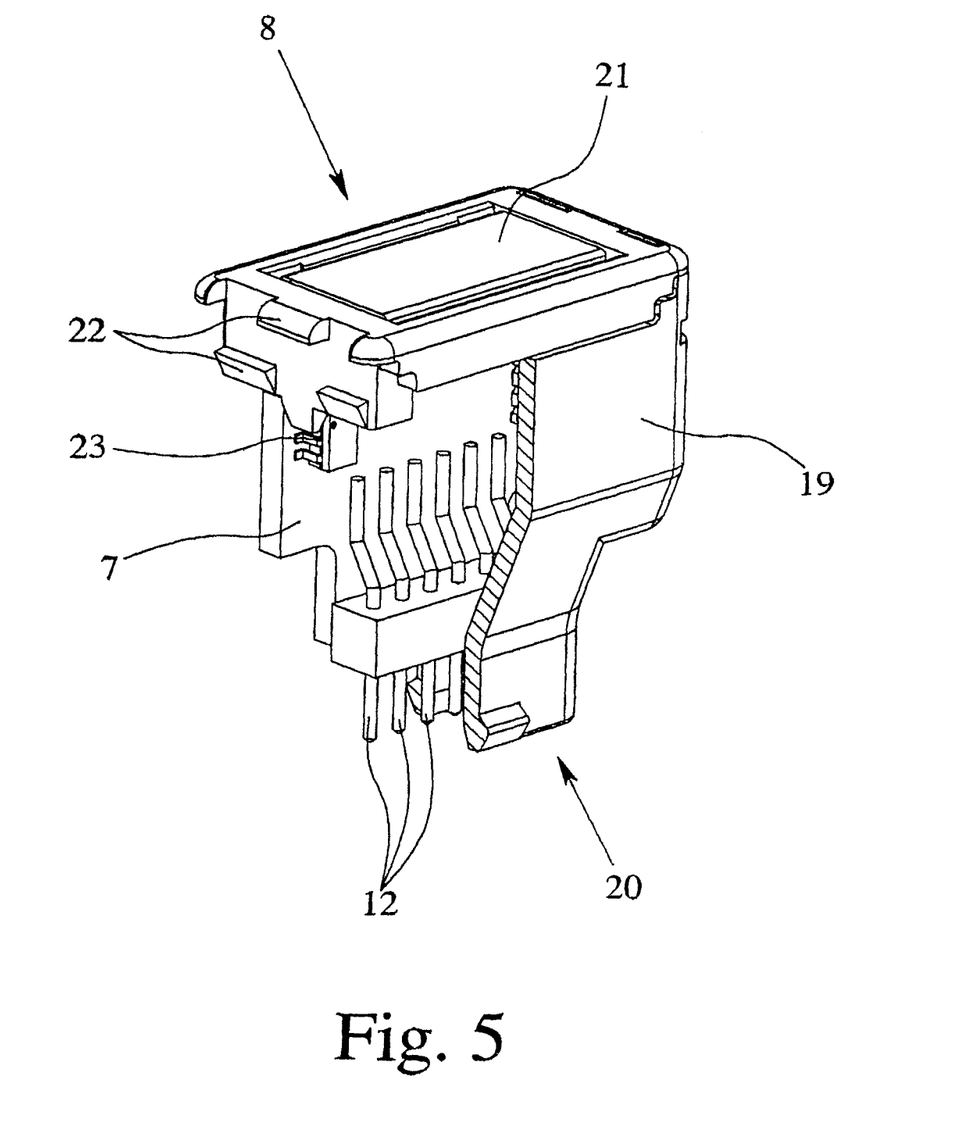
FIG. 5 is an enlarged, partially cutaway perspective view of the expansion module shown in FIG. 4.
Figure 6:
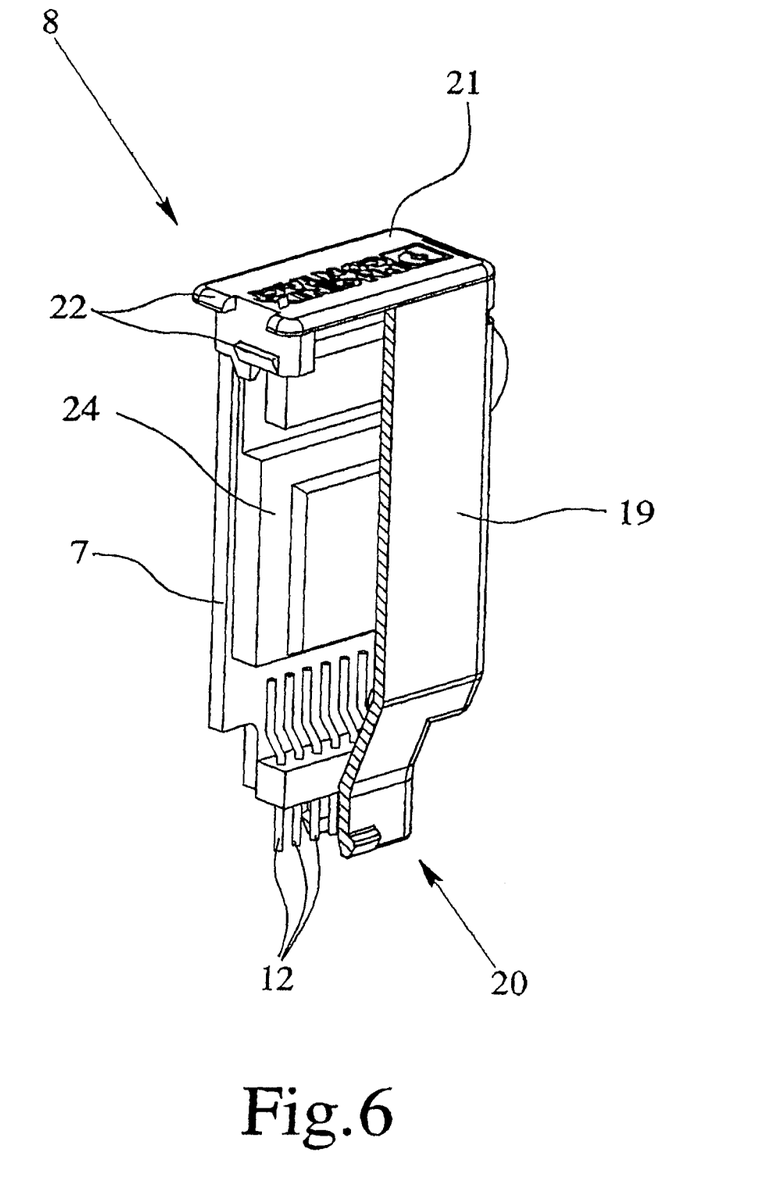
FIG. 6 is an enlarged, partially cutaway perspective view of another expansion module in accordance with the invention.

On the side of the housing 2, shown only partially here, an opening 6 is formed which is used for insertion of an electronic expansion module 8 which has a least one circuit board 7. If the expansion module 8, of which two different embodiments are shown in FIGS. 5 & 6, is inserted completely into the housing 2, electrical contact is made between the circuit board 5 of the field device 1 and the circuit board 7 of the expansion module 8 within a defined contact region 9. For this purpose the circuit board 5 of the field device 1 is connected to the corresponding contacts and the circuit board 7 of the expansion module 8 is connected to the corresponding mating contacts.

Figure 1A:
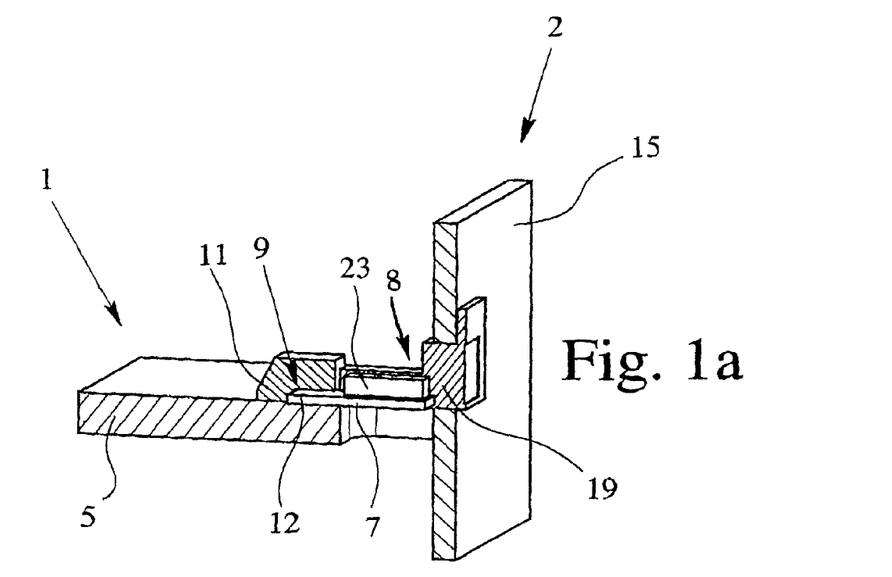
FIG. 1a is a simplified cross-sectional perspective view of a first embodiment of an electrical field device with an inserted expansion module.
Figure 1B:
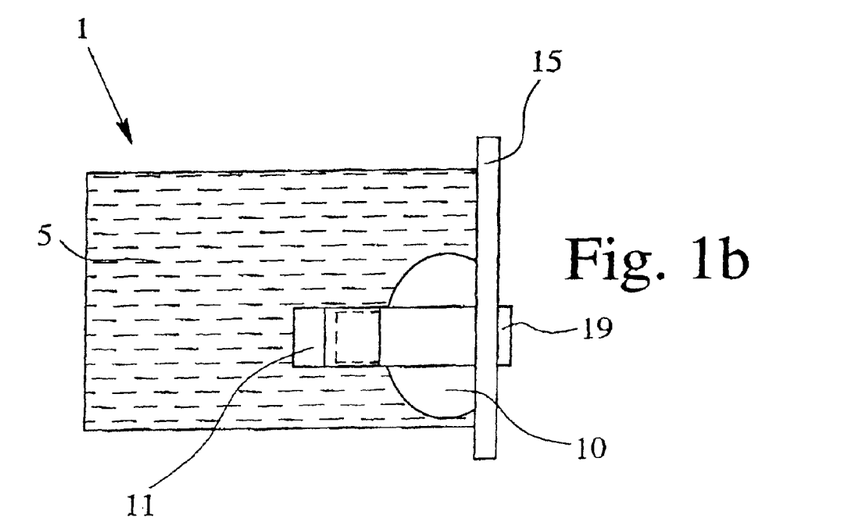
FIG. 1b is a top view of the electrical field device with the inserted expansion module.
Figure 2A:
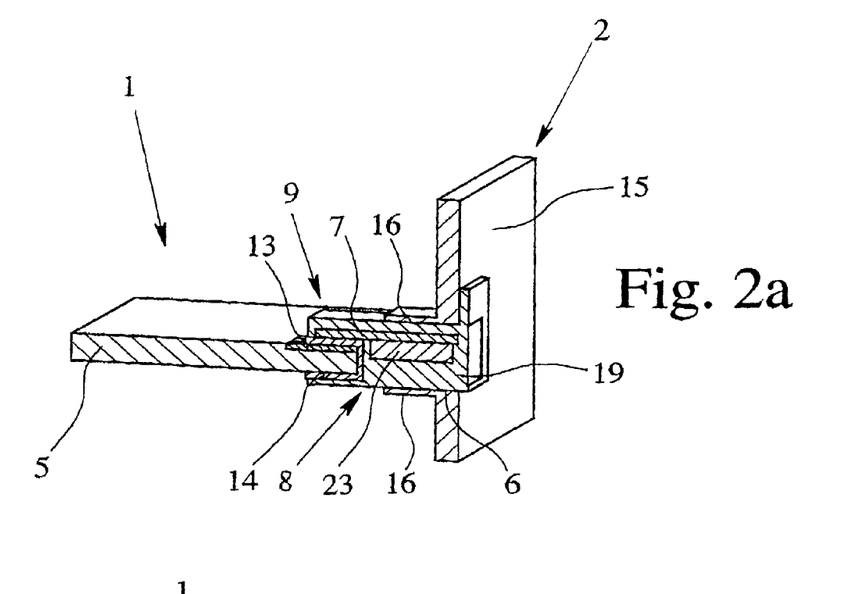
FIGS. 2a & 2b are view corresponding to FIGS. 1a & 1b of a second embodiment of an electrical field device with the inserted expansion module.
Figure 2B:
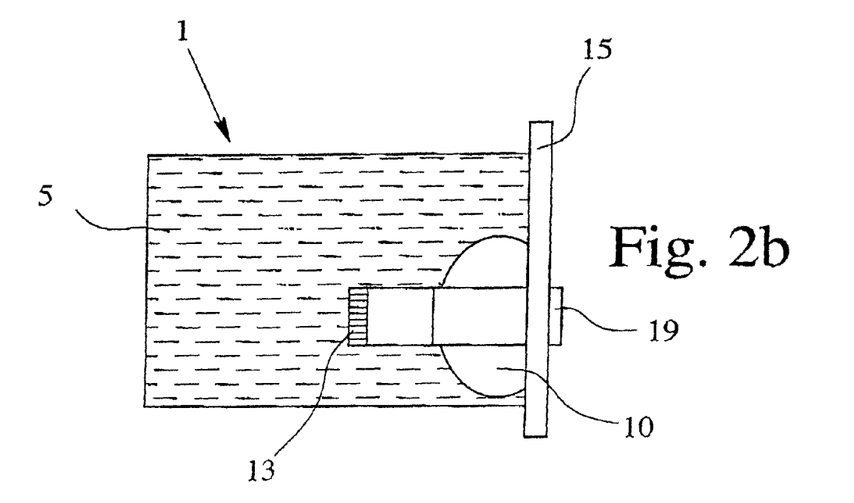

As is apparent especially from the two top views as shown in FIG. 1b and FIG. 2b, an essentially hemispherical recess 10 is formed in the circuit board 5 of the field device 1, the execution and arrangement of which ensures that standards with respect to reliable separation which require certain minimum clearances in air and minimum creepage distances are maintained. The formation of the recess 10 in the circuit board 5 of the field device 1 and the configuration of the expansion module 8 which is described in greater detail below ensure that there is an electrically conductive connection between the field device 1 and the circuit board 5, and the expansion module 8 and its circuit board 7 only in the contact region 9.

The two field devices 1 and expansion modules 8 shown in FIGS. 1a/1b & 2a/2b differ from one another in that, in the field device 1 as shown in FIGS. 1a/1b, the circuit board 5 has a socket 11 in the contact region 9 and the circuit board 7 of the expansion module 8 has corresponding plug-in contacts 12 which can be inserted into the socket 11. In the embodiment as shown in FIG. 2, the circuit board 5 of the field device 1 has the corresponding plug-in contacts 13 in the contact region 1, while the circuit board 7 of the expansion module 8 is connected to a corresponding socket 14 into which the plug-in contacts 13 can be inserted. The electrical connection between the circuit board 5 of the field device 1 and the circuit board 7 of the expansion module 8 takes place by a plug-socket connection. The plug-in contacts 12, 13 are made as direct board plugs on the surface of the circuit boards 5, 7, the plug-in contacts 12, 13, being preferably at least partially gilded in order to ensure permanent, reliable contact-making.

Figure 3:
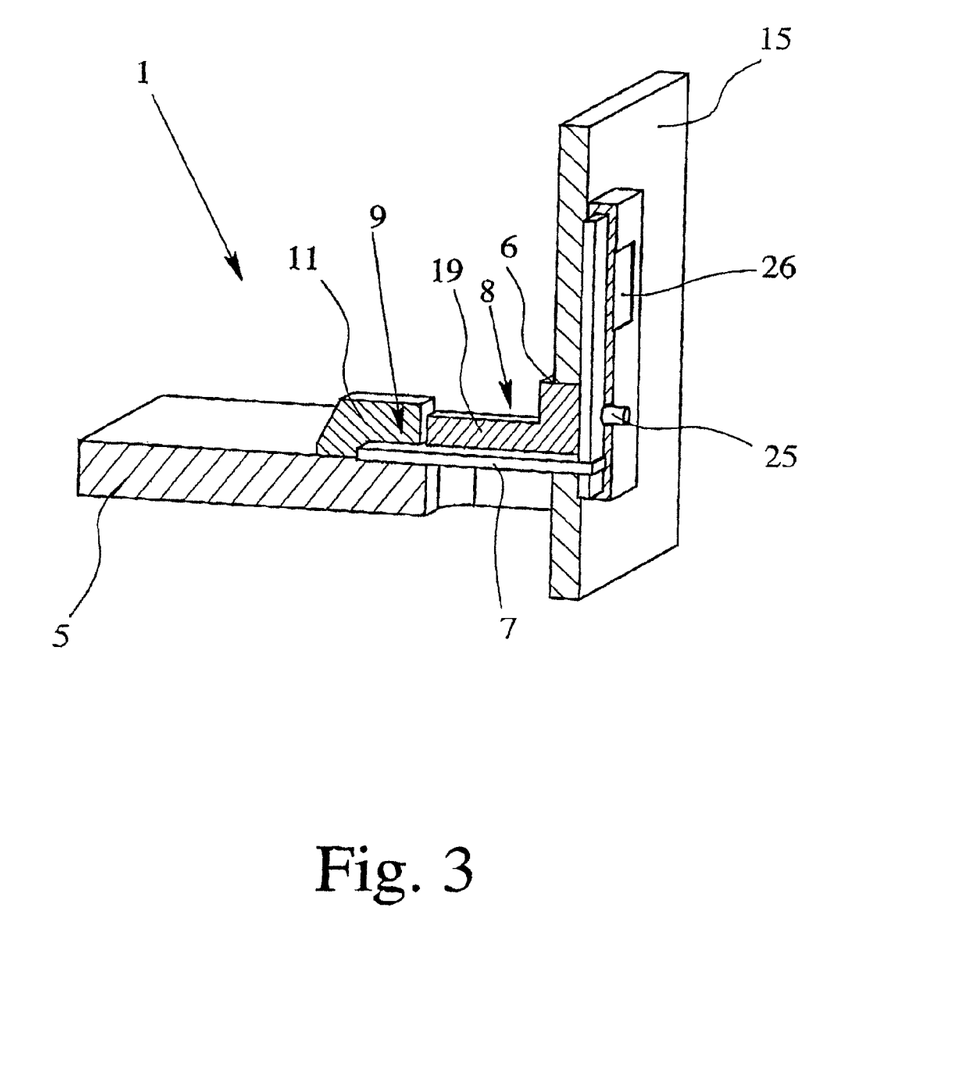
FIG. 3 is a simplified cross-sectional perspective view of a third embodiment of an electrical field device with an inserted expansion module.

The side of the housing 2 in which the opening 6 is made in the illustrated embodiments is the front 15 of the housing 2. In this way, the opening 6 is especially easily accessible so that insertion of the expansion module 8 can be carried out especially easily. For the embodiments as shown in FIGS. 1 & 3, in which the circuit board 5 of the field device 1 has a socket 11 for holding the circuit board 7 of the expansion module 8, the circuit board 5 also at least partially takes over mechanical guidance and support of the expansion module 8. For the embodiment as shown in FIG. 2, in which a socket 14 is formed on the circuit board 7 of the expansion module 8, to guide the expansion module 8, there are guide ribs 16 on rear side of the front 15 of the housing 2 which extend into the interior of the housing 2. Corresponding guide ribs 16 can, of course, also be provided in the embodiments of FIGS. 1 & 3.

Figure 7:
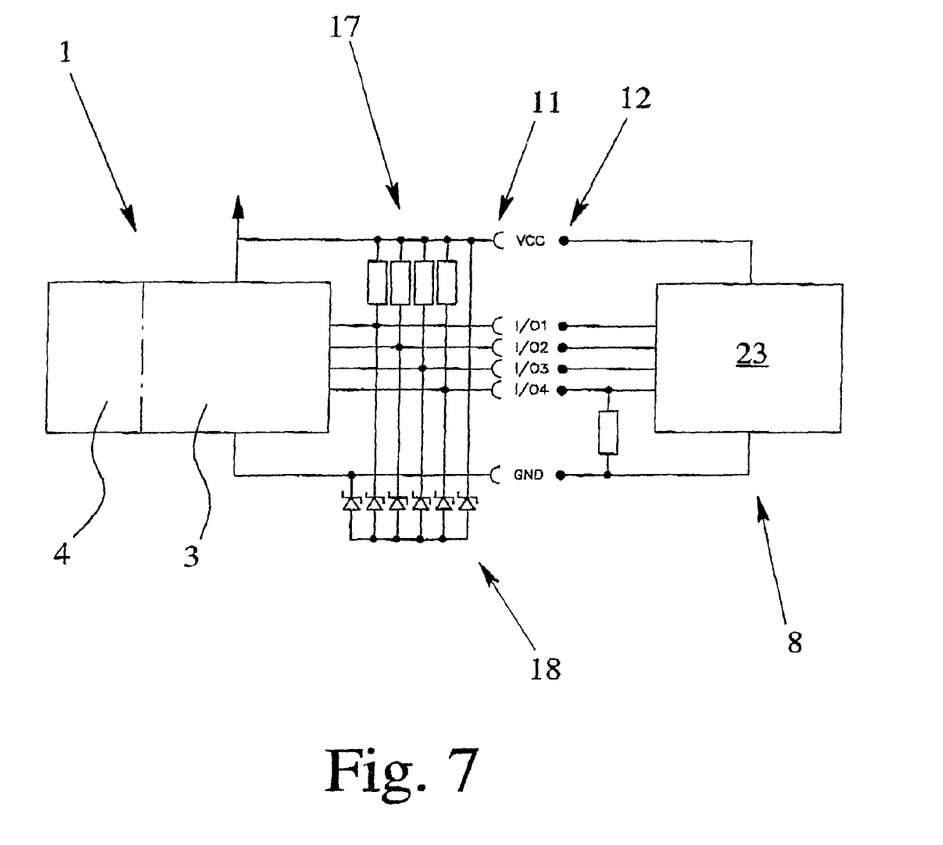
FIG. 7 is a circuit diagram of the electrical connection of the electrical field device and the expansion module.

FIG. 7 shows a simplified circuit diagram of the electrical structure of the field device 1 and an expansion module 8, here, especially with respect to the field device 1, only a part of the circuit being shown which is used for electrical contact-making of the field device 1 and its microcontroller 4 with the expansion module 8. The electrical circuit of the field device 1 includes, first of all, the microcontroller 3 with its internal memory 4. Via the corresponding printed conductors which are made on the circuit board 5, the inputs of the microcontroller 3 are connected to the contacts made as sockets 11, and are made as direct board plugs on the top of the circuit board 5. Between the microcontroller 3 and the sockets 11, a resistor array 17 is connected for termination of the inputs of the microcontroller 3. Moreover, the circuit also has a diode array 18 which is used as overvoltage protection for the microcontroller 3.

The expansion module 8 is supplied with the operating voltage required by it via the contacts $V_{CC}$ and GND of the circuit board 5 and of the microcontroller 3. Depending on the configuration of the expansion module 8 the mating contacts of the expansion module 8 which are made as plug-in contacts are wired differently so that the microcontroller 3 of the field device 1 using the wiring of the plug-in contacts 12 can detect the type of connected expansion module 8. Differentiating of the individual expansion modules 8 takes place especially using the pattern of the mating contacts of the expansion module 8 which are connected to the reference potential or the ground potential GND.

The mechanical structure of the expansion module 8 can be recognized especially from FIGS. 5 & 6. The expansion module 8 has a housing 19 in which the circuit board 7 is held. The circuit board 7 is located in the housing 19 such that only the mating contacts which are made here as plug-in contacts 12 protrude from the end side 20 of the housing 19 or are accessible from the end side 20 of the housing 19. The corresponding, of course, also applies to the case in which there is a socket 14 on the circuit board 7. For reliable isolation of the circuit board 7 which is located within the housing 11, the circuit board 7 can be potted in the housing made of plastic.

Figure 4:
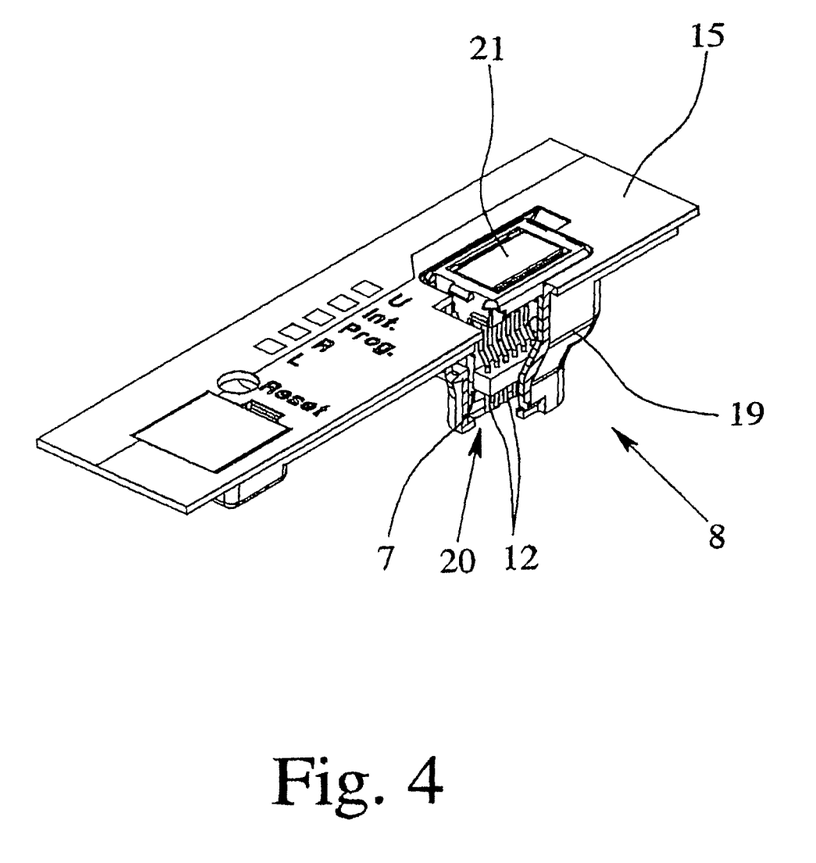
FIG. 4 is a perspective of an expansion module which has been inserted into the housing.

On the side of the housing 11, opposite the end 20, in the embodiments of an expansion module 8 which are shown in FIGS. 4-6, there is an inscription field 21. Moreover the housing 19 on the side of the housing 19 opposite the end 20 has several catch projections 22 by means of which the expansion module 8 can be fastened within the opening 6 in the front side 15 of the electrical field device 1.

The expansion module 8 shown in FIG. 5 is designed as a configuration memory so that there is a corresponding memory module 23 on the circuit board 7. The corresponding wiring of this expansion module 8 is shown in FIG. 7. The expansion module 8, here, is a passive module which only reacts when it is addressed by the microcontroller 3 of the electrical field device 1 acting as the master. Preferably, data transmission then takes place bi-directionally over a connecting line between the microcontroller 3 and the memory module 23.

Figure 8:
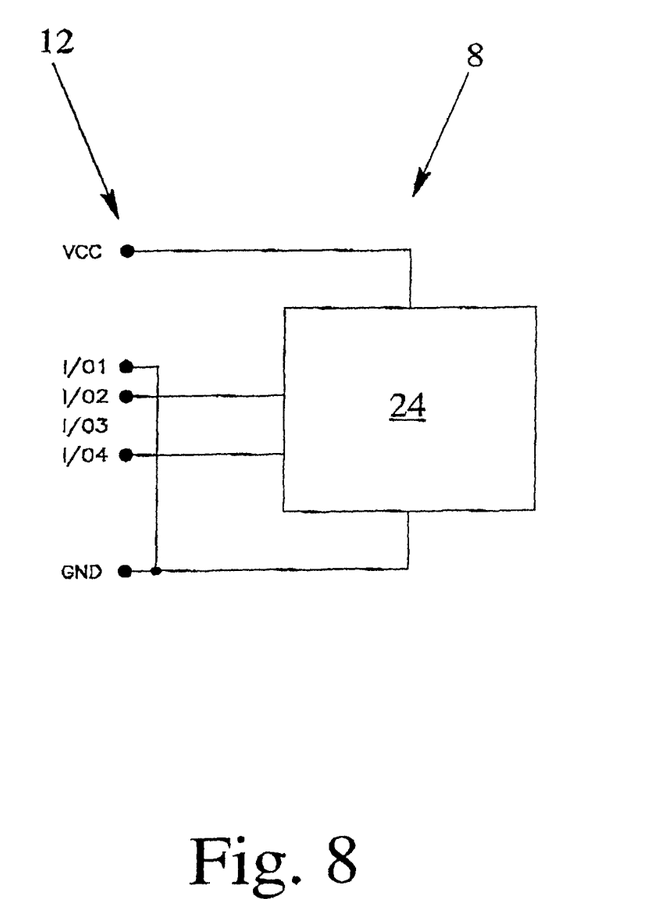
FIG. 8 is a circuit diagram of an embodiment of an expansion module.

The expansion module 8 as shown in FIG. 6 is designed to be an interface, especially a BLUETOOTH® wireless interface, for which there is a corresponding transceiver 24 on the circuit board 7. The pertinent wiring of such an expansion module 8 is shown in FIG. 8. This expansion module 8 assumes the function of a master, i.e., it initiates data exchange with the microcontroller 3 of the electrical field device 1. Data exchange proceeds, preferably, unidirectionally over two data lines between the inputs of the microcontroller 3 and the corresponding inputs of the transceiver 24. Instead of a transceiver 24, this expansion module 8 can also have a controller so that such an expansion module 8 can also be used as an adapter, for example, as an USB adapter. In this case, the circuit board 7, on the side opposite the end 20 is connected to another socket, for example, a USB socket or directly to a cable.

FIG. 3 shows an embodiment of an expansion module 8 which is made as an operating part. On the side of the housing 19 opposite the end 20, this expansion module 8 has a control panel with two keys 25 and a display 26. Individual parameters of the electrical field device can be set and/or displayed via the keys 25 and the display 26.

What is claimed is:

1. Hardware unit, comprising an electrical field device and an expansion module, wherein the electrical field device has a housing with an opening formed on one side thereof, at least one input, at least one output, and an electronic circuit which has a microcontroller, a memory and a circuit board, and wherein the expansion module has a housing and an electronic circuit with a circuit board, wherein the circuit board of the expansion module has mating contacts on an end for making electrical contact with contacts which are connected to the circuit board of the electrical field device, the contacts which are connected to the circuit board of the electrical field device being accessible from outside of the housing, and wherein an open recess is formed in the circuit board of the electrical field device into which the expansion module is inserted via the opening of the housing of the field device in a manner such that the expansion module does not have any conductive contact with the field device except in the region of the mating contacts due to the open recess in the circuit board of the field device being larger than the expansion module except within a region at which the contacts that are connected to the circuit board of the electrical field device are located.

2. Hardware unit in accordance with claim 1, wherein the mating contacts are plug-in contacts for insertion into a socket connected to the circuit board of the electrical field device.

3. Hardware unit in accordance with claim 1, wherein an inscription field is provided on an end of the housing of the expansion module opposite the mating contacts.

4. Hardware unit in accordance with claim 1, wherein the circuit board of the expansion module is connected to a memory module so that the expansion module is adapted to function as a configuration memory or as a long term memory.

5. Hardware unit in accordance with claim 1, wherein the circuit board of the expansion module is connected to a transceiver so that the expansion module is adapted to function as an interface.

6. Hardware unit in accordance with claim 1, wherein the circuit board of the expansion module is connected to a wireless transceiver so that the expansion module is adapted to function as a wireless interface.

7. Hardware unit in accordance with claim 1, wherein the circuit board of the expansion module is connected to the controller and is connect to a socket on a side opposite the mating contacts, so that the expansion module is able to function as an adapter.

8. Hardware unit in accordance with claim 1, wherein the circuit board of the expansion module is connected to the controller and is connected to a USB socket on an end opposite the mating contacts, so that the expansion module is able to function as a USB adapter.

9. Hardware unit in accordance with claim 1, wherein on an end of the housing of the expansion module opposite the mating contacts, there is a control panel with at least one key and a display.

\* \* \* \* \*